US011012039B2

(12) United States Patent
Huang

(10) Patent No.: US 11,012,039 B2
(45) Date of Patent: May 18, 2021

(54) SIGNAL PROCESSING CIRCUIT WITH REDUCTION OR CANCELATION OF SIGNAL-DEPENDENT COMPONENT

(71) Applicant: NOVATEK Microelectronics Corp., Hsin-Chu (TW)

(72) Inventor: Min Huang, Taoyuan (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 34 days.

(21) Appl. No.: 16/393,942

(22) Filed: Apr. 24, 2019

(65) Prior Publication Data

US 2020/0343864 A1 Oct. 29, 2020

(51) Int. Cl.
*H03F 3/45* (2006.01)
*H03F 3/00* (2006.01)
*H03F 1/56* (2006.01)

(52) U.S. Cl.
CPC .............. *H03F 3/005* (2013.01); *H03F 1/56* (2013.01)

(58) Field of Classification Search
CPC ....................................................... H03F 3/45
USPC ..................................................... 330/9, 252
See application file for complete search history.

(56) References Cited

U.S. PATENT DOCUMENTS

| 7,733,168 | B2* | 6/2010 | Higuchi | H03F 3/005 330/9 |
| 10,461,771 | B2* | 10/2019 | Doorenbos | H03M 3/464 |
| 2005/0040886 | A1* | 2/2005 | Fujimoto | H03F 3/005 330/9 |

* cited by examiner

Primary Examiner — Henry Choe
(74) Attorney, Agent, or Firm — Winston Hsu

(57) ABSTRACT

A signal processing circuit, which has a pair of input nodes and a pair of output nodes, includes a first switch pair, a second switch pair, an amplifier, a first compensation capacitor and a second compensation capacitor. The first switch pair is coupled between the pair of input nodes and a plurality of floating nodes. The second switch pair is coupled between the plurality of floating nodes and the pair of output nodes. The amplifier is coupled between the plurality of floating nodes and the pair of output nodes. The first compensation capacitor is coupled between a first floating node among the plurality of floating nodes and a first output node among the pair of output nodes. The second compensation capacitor is coupled between a second floating node among the plurality of floating nodes and the first output node.

20 Claims, 6 Drawing Sheets

SIGNAL PROCESSING CIRCUIT WITH REDUCTION OR CANCELATION OF SIGNAL-DEPENDENT COMPONENT

BACKGROUND OF THE INVENTION

1. Field of the Invention

The present invention relates to a signal processing circuit, and more particularly, to a signal processing circuit capable of receiving and processing sensing signals from a sensor.

2. Description of the Prior Art

With advancements in technology, mobile devices such as smart phones, tablets, laptops, GPS navigation systems and electronic books have become indispensable in our daily life. Compared with conventional mobile phones that only have communication functions, modern mobile devices combine various functions such as communication, networking, photographing, games and data processing. This type of multifunctional design is more attractive to consumers. Fingerprint recognition is a popular function for security and privacy in various electronic devices including mobile devices, and can be implemented in different techniques such as capacitive sensing, optical (image sensing), thermal, ultrasonic, etc. For example, a mobile phone may have a fingerprint recognition interface built into a home button or in a dedicated region to detect user fingerprint.

Among those fingerprint recognition techniques, the capacitive fingerprint recognition scheme has become a popular way for implementing fingerprint recognition. With capacitive fingerprint recognition, the sensing pixels in a fingerprint sensor may fetch the capacitance of a touch finger, where the capacitance is processed and converted into a voltage signal which is further forwarded to a follow-up signal processing circuit such as an analog front-end (AFE) circuit to be recognized. The AFE circuit requires a switched-capacitor integrator which continuously receives sensing signals from a sensing pixel and converts and amplifies the sensing signals.

An input signal received by the switched-capacitor integrator may include the abovementioned sensing signal and a reset signal. The reset signal is a predetermined signal received during a reset period of the sensing pixel. During a sensing period of the sensing pixel, the photodiode of the sensing pixel starts exposure and thereby generates electronic signals, and the corresponding switch in the sensing pixel is turned on to forward the electronic signals or corresponding voltage signals to the AFE circuit. These signals are regarded as the sensing signals which are superposed on the reset signal to be received by the switched-capacitor integrator. However, due to different brightness sensed by the photodiode, different quantities of electronic signals may be generated in each cycle, resulting in different magnitudes of sensing signals received by the switched-capacitor integrator. The variations of received sensing signals may cause the integrator to enter an abnormal voltage range, such that the voltage signals outputted to the follow-up circuit may be saturated. In addition, the charge injection problem in the switched-capacitor integrator may become more serious due to large variations of received sensing signals. Thus, there is a need for improvement over the prior art.

SUMMARY OF THE INVENTION

It is therefore an objective of the present invention to provide a capacitive compensation scheme for a signal processing circuit such as a switched-capacitor integrator, which is capable of reducing or canceling a signal-dependent component at the floating nodes of the signal processing circuit, so as to maintain the floating nodes within a small voltage range.

An embodiment of the present invention discloses a signal processing circuit having a pair of input nodes and a pair of output nodes. The signal processing circuit comprises a first switch pair, a second switch pair, an amplifier, a first compensation capacitor and a second compensation capacitor. The first switch pair is coupled between the pair of input nodes and a plurality of floating nodes. The second switch pair is coupled between the plurality of floating nodes and the pair of output nodes. The amplifier is coupled between the plurality of floating nodes and the pair of output nodes. The first compensation capacitor is coupled between a first floating node among the plurality of floating nodes and a first output node among the pair of output nodes. The second compensation capacitor is coupled between a second floating node among the plurality of floating nodes and the first output node.

Another embodiment of the present invention discloses a signal processing circuit having a pair of input nodes and a pair of output nodes. The signal processing circuit comprises a first switch pair, a second switch pair, an amplifier, a first compensation capacitor and a second compensation capacitor. The first switch pair is coupled between the pair of input nodes and a plurality of floating nodes. The second switch pair is coupled between the plurality of floating nodes and the pair of output nodes. The amplifier is coupled between the plurality of floating nodes and the pair of output nodes. The first compensation capacitor is coupled between a first floating node among the plurality of floating nodes and a reference node. The second compensation capacitor is coupled between a second floating node among the plurality of floating nodes and the reference node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
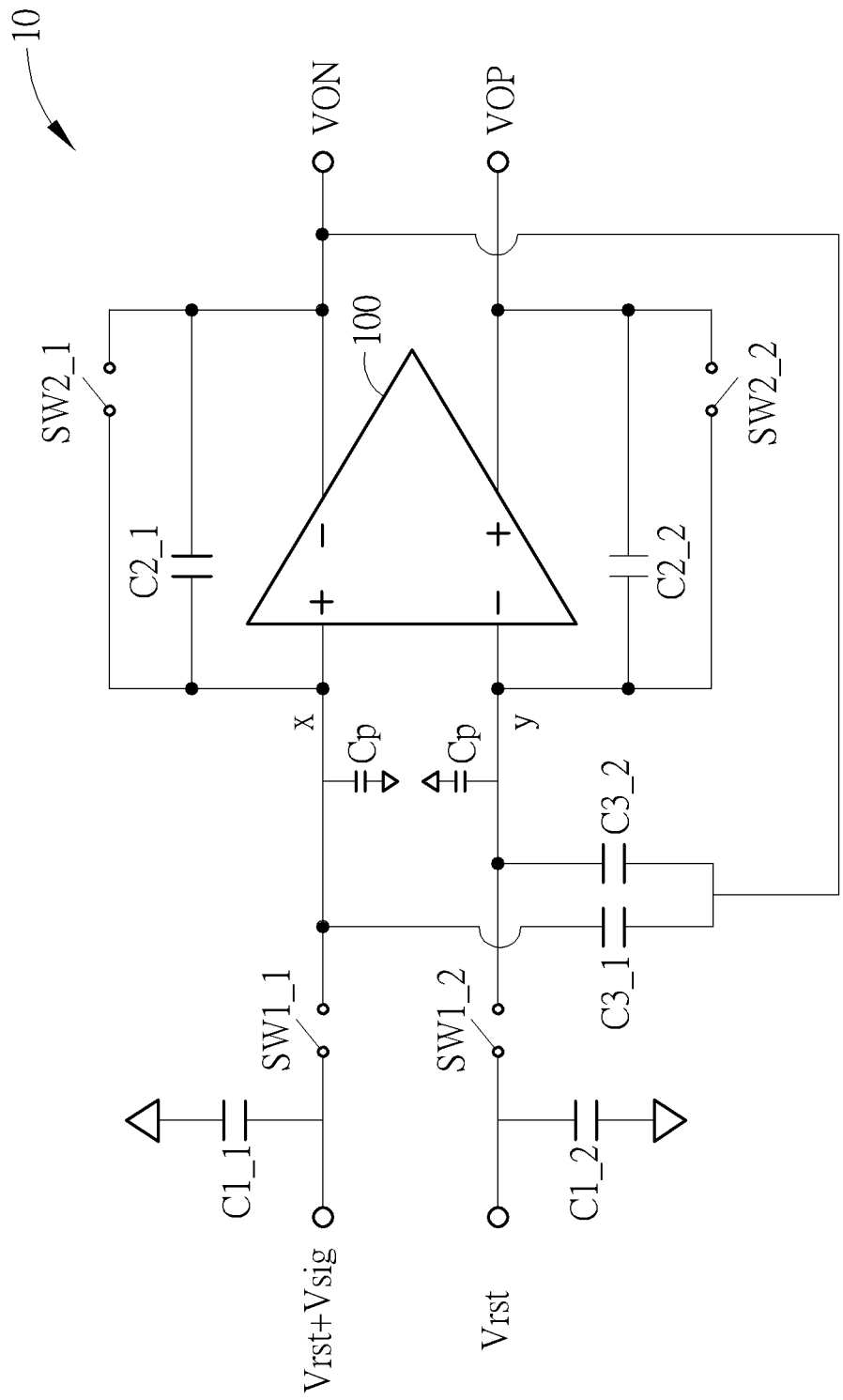
FIG. 1 is a schematic diagram of a switched-capacitor integrator according to an embodiment of the present invention.

Please refer to FIG. 1, which is a schematic diagram of a switched-capacitor integrator 10 according to an embodiment of the present invention. As shown in FIG. 1, the switched-capacitor integrator 10 has a differential structure, which includes a pair of input nodes configured to receive an input signal pair from a sensor such as the sensing pixel of the fingerprint sensor, and a pair of output nodes at which output signals VON and VOP are respectively generated. As mentioned above, in the reset period where sensing has not started, the sensor may output a reset signal Vrst, which is received by an input node of the switched-capacitor integrator 10. After the sensing operation is complete, the sensor may output a sensing signal Vsig superposed on the reset signal Vrst, which are received by another input node of the switched-capacitor integrator 10. The switched-capacitor integrator 10 thereby outputs a differential output signal VOP−VON based on the received sensing signal Vsig.

In detail, the switched-capacitor integrator 10 includes an input switch pair SW1_1 and SW1_2, a reset switch pair SW2_1 and SW2_2, an amplifier 100, an input capacitor pair C1_1 and C1_2, a feedback capacitor pair C2_1 and C2_2, and a compensation capacitor pair C3_1 and C3_2. The input switch pair SW1_1 and SW1_2 is coupled between the pair of input nodes of the switched-capacitor integrator 10 and floating nodes x and y, respectively. The reset switch pair SW2_1 and SW2_2 is coupled between the floating nodes x and y and the pair of output nodes of the switched-capacitor integrator 10, respectively. The input capacitor pair C1_1 and C1_2 is coupled to the pair of input nodes, respectively. The feedback capacitor pair C2_1 and C2_2 is coupled between the floating nodes x and y and the pair of output nodes of the switched-capacitor integrator 10, respectively. The compensation capacitor C3_1 is coupled between the floating node x and an output node, and the compensation capacitor C3_2 is coupled between the floating node y and the same output node. The amplifier 100 is coupled between the floating nodes x and y and the pair of output nodes. More specifically, the amplifier 100 has a differential structure, which includes a positive input terminal, a negative input terminal, a positive output terminal and a negative output terminal. As shown in FIG. 1, the positive and negative input terminals are coupled to the floating nodes x and y, respectively, and the positive and negative output terminals are coupled to the pair of output nodes of the switched-capacitor integrator 10, for outputting the output signals VOP and VON, respectively. FIG. 1 further illustrates parasitic capacitors Cp coupled to the floating nodes x and y. The parasitic capacitors Cp may influence the transfer function of the switched-capacitor integrator 10, and the amplifier 100 with differential structure aims at reducing or eliminating the influence of the parasitic capacitors Cp in the differential output signal (VOP minus VON).

In this embodiment, the input signal pair Vrst+Vsig and Vrst is received by the pair of input nodes of the switched-capacitor integrator 10 and then stored in the input capacitor pair C1_1 and C1_2, respectively. When the input switch pair SW1_1 and SW1_2 is turned on, the input signals Vrst+Vsig and Vrst are forwarded to the floating nodes x and y, respectively. The amplifier 100 may receive the input signals Vrst+Vsig and Vrst, and amplify the sensing signal component Vsig to generate the differential output signal VOP-VON.

Figure 2A:
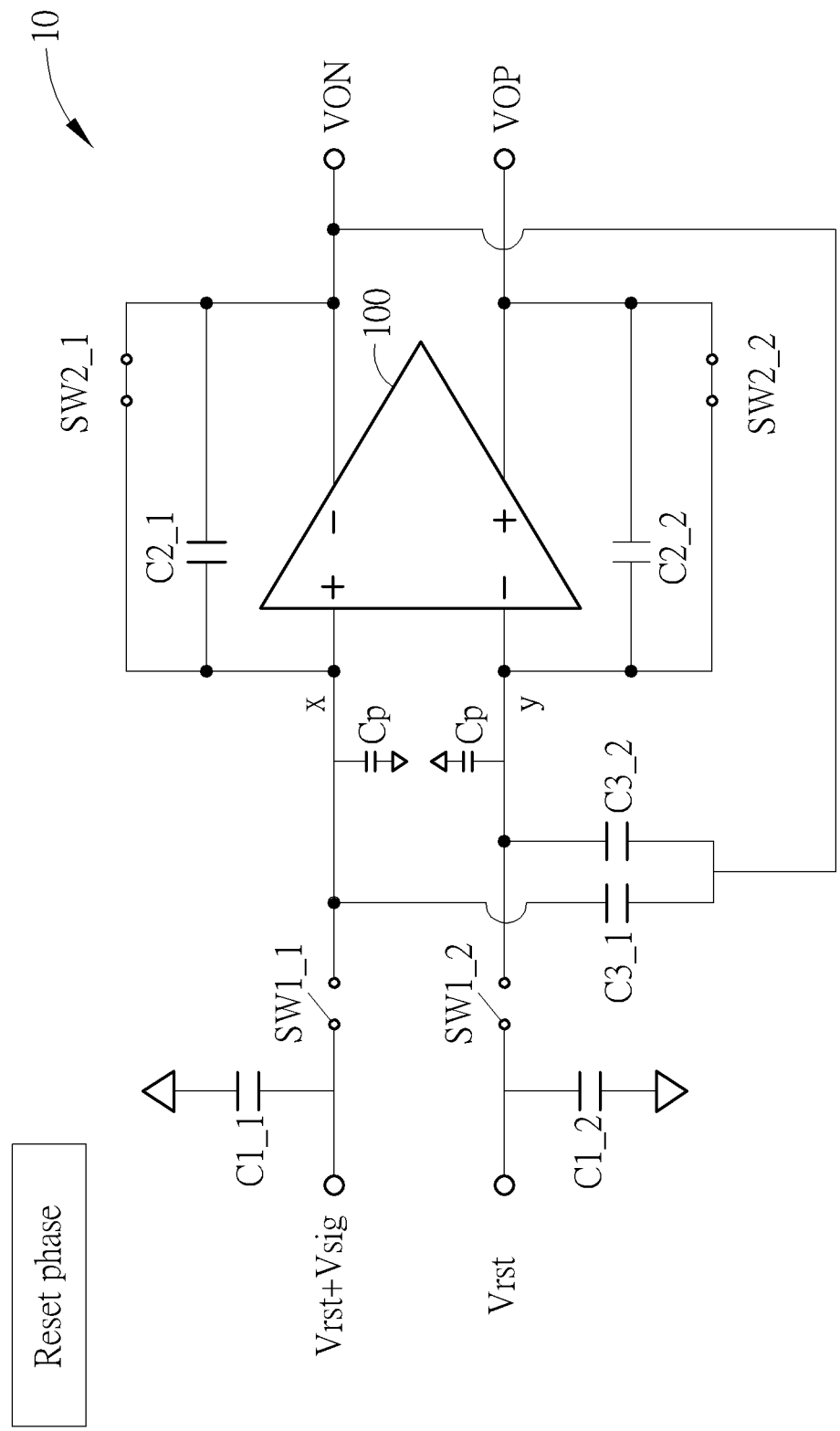
FIGS. 2A and 2B illustrate the statuses of the switched-capacitor integrator in the reset phase and the conversion phase, respectively.
Figure 2B:
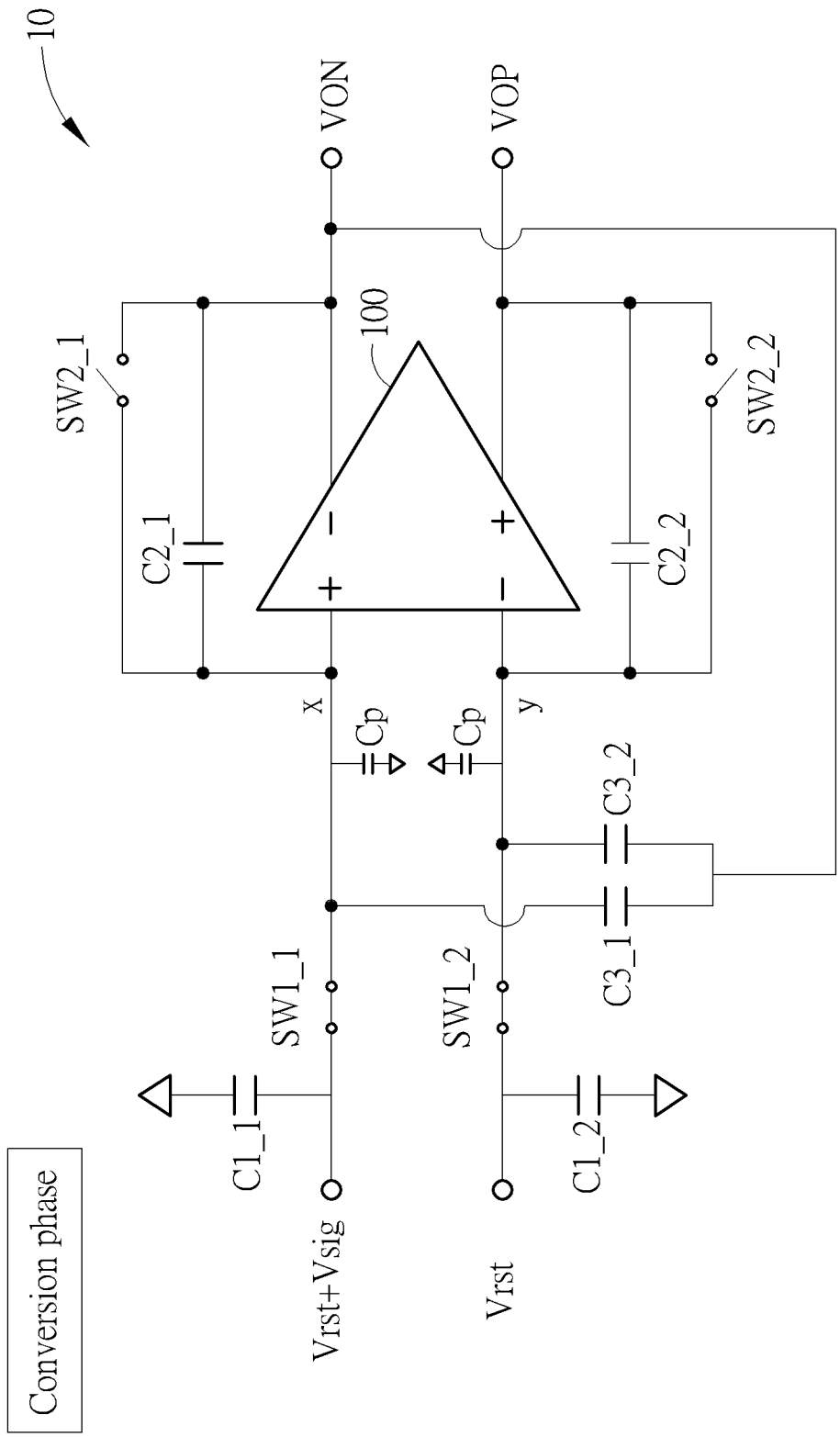

In detail, the switched-capacitor integrator 10 may have two operation phases, a reset phase and a conversion phase, based on switching of the input switch pair SW1_1 and SW1_2 and the reset switch pair SW2_1 and SW2_2. FIGS. 2A and 2B illustrate the statuses of the switched-capacitor integrator 10 in the reset phase and the conversion phase, respectively. As shown in FIG. 2A, in the reset phase, the input switch pair SW1_1 and SW1_2 is turned off, and the reset switch pair SW2_1 and SW2_2 is turned on. The turned-on reset switch pair SW2_1 and SW2_2 connects the floating nodes x and y to the output nodes of the switched-capacitor integrator 10, so that the voltages at the floating nodes x and y are reset to a common-mode voltage Vcom of the switched-capacitor integrator 10. The common-mode voltage Vcom may be well configured as a fixed voltage value.

As shown in FIG. 2B, in the conversion phase, the reset switch pair SW2_1 and SW2_2 is turned off, and the input switch pair SW1_1 and SW1_2 is turned on. The turned-on input switch pair SW1_1 and SW1_2 couples the input signal pair Vrst+Vsig and Vrst to the floating nodes x and y, respectively, allowing the amplifier 100 to perform amplification and conversion on the sensing signal Vsig.

The detailed operations of the switched-capacitor integrator 10 are described as follows. Observe the total charges at the floating nodes x and y in different phases. In the reset phase, the total charges $q_x$ at the floating node x and the total charges $q_y$ at the floating node y are obtained as follows:

$$q_x = Cp \times Vcom;$$

$$q_y = Cp \times Vcom.$$

In the conversion phase, the total charges $q_x$ at the floating node x and the total charges $q_y$ at the floating node y are obtained as follows:

$$q_x = C1 \cdot Vx + C2 \cdot (Vx - VON) + C3 \cdot (Vx - VON) + Cp \cdot Vx;$$

$$q_y = C1 \cdot Vx + C2 \cdot (Vx - VOP) + C3 \cdot (Vx - VON) + Cp \cdot Vx.$$

Considering charge conservation on the floating nodes x and y from the reset phase to the conversion phase, two equations may be obtained as follows:

$$C1 \cdot (Crst + Vsig) + Cp \cdot Vcom = C1 \cdot Vx + C2 \cdot (Vx - VON) + C3 \cdot (Vx - VON) + Cp \cdot Vx; \quad (1)$$

$$C1 \cdot Vrst + Cp \cdot Vcom = C1 \cdot Vx + C2 \cdot (Vx - VOP) + C3 \cdot (Vx - VON) + Cp \cdot Vx; \quad (2)$$

wherein C1 is the capacitance value of the input capacitor pair C1_1 and C1_2, C2 is the capacitance value of the feedback capacitor pair C2_1 and C2_2, C3 is the capacitance value of the compensation capacitor pair C3_1 and C3_2, Cp is the capacitance value of the parasitic capacitors Cp, and Vx is the voltage at the floating nodes x and y. Note that the input terminals of the amplifier 100 are virtually short-circuited so that the voltages of the floating nodes x and y may be equal. By subtracting Equation (1) from Equation (2) or subtracting Equation (2) from Equation (1), the differential output signal VOP-VON may be obtained as:

$$VOP - VON = \frac{C1}{C2} \cdot Vsig. \quad (3)$$

According to the circuit structure of the switched-capacitor integrator 10 and the above derivation of formulas, the amplifier 100, the input capacitor pair C1_1 and C1_2, and the feedback capacitor pair C2_1 and C2_2 cooperate to determine the differential output signal VOP-VON based on switching control of the input switch pair SW1_1 and SW1_2 and the reset switch pair SW2_1 and SW2_2. The compensation capacitor pair C3_1 and C3_2 is further included to reduce or cancel signal dependency of the floating nodes x and y without changing the output signal values. More specifically, the compensation capacitor pair C3_1 and C3_2 may reduce or cancel the voltage swing on the floating nodes x and y generated from the variations of received sensing signals due to different brightness sensed by the photodiode. Meanwhile, the transfer function of the switched-capacitor integrator 10 may not be modified by the compensation capacitor pair C3_1 and C3_2. In other words, the compensation capacitor pair C3_1 and C3_2 may not change the relation of the sensing signal Vsig and the differential output signal VOP-VON as described in Equation (3).

The operations of the compensation capacitor pair C3_1 and C3_2 for reducing or canceling signal dependency of the floating nodes x and y are shown below. Due to common-mode feedback, the output signals VOP and VON and the common-mode voltage Vcom have the following relationship:

$$VOP + VON = 2 \cdot Vcom;$$

which leads to:

$$VOP = Vcom + \frac{1}{2} \cdot \frac{C1}{C2} \cdot Vsig; \quad (4)$$

$$VON = Vcom - \frac{1}{2} \cdot \frac{C1}{C2} \cdot Vsig. \quad (5)$$

Substituting Equations (4) and (5) into any one of Equation (1) and Equation (2) may obtain:

$$C1 \cdot Vrst + Cp \cdot Vcom = (C1 + C2 + C3 + Cp) \cdot Vx - (C2 + C3) \cdot Vcom - C2 \cdot \frac{1}{2} \cdot \frac{C1}{C2} \cdot Vsig + C3 \cdot \frac{1}{2} \cdot \frac{C1}{C2} \cdot Vsig.$$

After organizing the equation, the voltage Vx at the floating nodes x and y may be obtained as follows:

$$Vx = \frac{C1 \cdot Vrst + (C2 + C3 + Cp) \cdot Vcom + 0.5 \cdot \frac{C1}{C2} Vsig(C2 - C3)}{C1 + C2 + C3 + Cp}. \quad (6)$$

Equation (6) shows that the voltage Vx at the floating nodes x and y includes a reset-dependent component (regarding Vrst), a common-mode voltage component (regarding Vcom), and a signal-dependent component (regarding Vsig). Note that the reset signal Vrst is a predetermined signal received during a reset period of the sensing pixel and has a fixed value, and that the common-mode voltage Vcom is a predetermined voltage in the switched-capacitor integrator 10 and also has a fixed value; hence, the reset-dependent component and the common-mode voltage component are fixed. However, due to variation of the sensing signals Vsig, the signal-dependent component is variable, which causes that the voltage Vx at the floating nodes x and y becomes variable and may exceed the normal voltage range of the switched-capacitor integrator 10 if the variation of the sensing signals Vsig is large. In order to decrease the signal-dependent component, the compensation capacitor pair C3_1 and C3_2 is applied. As shown in Equation (6), the signal-dependent component 0.5·C1/C2Vsig(C2−C3) includes a deduction factor −C3, which means that the signal-dependent component may be eliminated or compensated by the compensation capacitor pair C3_1 and C3_2. In an embodiment, the capacitance value C3 may be configured to be equal to the capacitance value C2, so as to entirely cancel the signal-dependent component. Substituting the equation C2=C3 into Equation (6) may obtain:

$$Vx = \frac{C1 \cdot Vrst + (2C2 + Cp) \cdot Vcom}{C1 + 2C2 + Cp}. \quad (7)$$

As shown in Equation (7), there is no signal-dependent component in the voltage Vx at the floating nodes x and y. In other words, the voltage Vx is independent to the sensing signal Vsig and will not be influenced by variations of the sensing signal Vsig.

On the other hand, in a switched-capacitor integrator without the compensation capacitor pair C3_1 and C3_2, the voltage at the floating nodes may be dependent to the sensing signal Vsig. For example, considering a circuit structure where the compensation capacitor pair C3_1 and C3_2 is removed from the switched-capacitor integrator 10, the voltage Vx at the floating nodes x and y may be obtained as follows:

$$Vx = \frac{C1 \cdot Vrst + (C2 + Cp) \cdot Vcom + 0.5 \cdot C1 \cdot Vsig}{C1 + C2 + Cp}. \quad (8)$$

Note that Equation (8) is obtained by substituting C3=0 in Equation (6). As can be seen, there is a signal-dependent component 0.5·C1·Vsig existing in the voltage Vx if no compensation capacitor pair is included.

As mentioned above, the charge injection problem in the switched-capacitor integrator 10 may become more serious due to the variations of received sensing signals Vsig. For example, voltage variations at the floating nodes x and y may worsen the charge injection problem. In general, the switched-capacitor integrator 10 operates based on switching of switch circuits including the input switch pair SW1_1 and SW1_2 and the reset switch pair SW2_1 and SW2_2. These switches have intrinsic charge injection when turned on. In an ideal differential structure, the charge injection effects may be canceled in the differential output signal VOP-VON. However, due to mismatch of the differential structure, the difference of charge injection effects on the positive terminal and negative terminal may be amplified, which generates an unpredicted error in the output signal VOP-VON. In addition, the magnitude of charge injection is highly related to the variation of charge quantities. For example, if there is a large voltage variation at the floating nodes x and y, the parasitic capacitor Cp should be charged and discharged continuously, which leads to a large variation on the charge injection effects. Therefore, in order to well control the influence of charge injection on the output signal VOP-VON, it is preferable to reduce or eliminate the voltage variation of the floating nodes x and y, and the compensation capacitor pair C3_1 and C3_2 serves this purpose. Therefore, the charge injection problem accompanied by the switched-capacitor operations may be improved by disposing the compensation capacitor pair C3_1 and C3_2.

Please note that the present invention aims at providing a pair of compensation capacitors disposed in the switched-capacitor integrator, for reducing or canceling the signal-dependent component in the voltage at the floating nodes, allowing the voltage at the floating nodes to be independent from the signal variations and maintained within a small voltage range. Those skilled in the art may make modifications and alternations accordingly. For example, in the above embodiment, the capacitance value C3 of the compensation capacitor pair C3_1 and C3_2 is configured to be equal to the capacitance value C2 of the feedback capacitor pair C2_1 and C2_2, so as to entirely cancel the signal-dependent component. However, it is not necessary to configure the value C3 to be equal to C2. As long as there is a compensation capacitor pair coupled to the floating nodes in the switched-capacitor integrator, the signal-dependent component in the voltage at the floating nodes may be decreased to some extent. As shown in Equation (6), the deduction factor −C3 reduces the level of signal dependence even if the value C3 is smaller than C2. In addition, in the above embodiments, the compensation capacitor pair is applied to the switched-capacitor integrator. In another embodiment, the compensation capacitor pair may be applicable to any other type of signal processing circuit. As long as the signal processing circuit has a differential structure, the compensation capacitor pair may be disposed to reduce or cancel the voltage variation and signal dependency on specific node(s).

Figure 3:
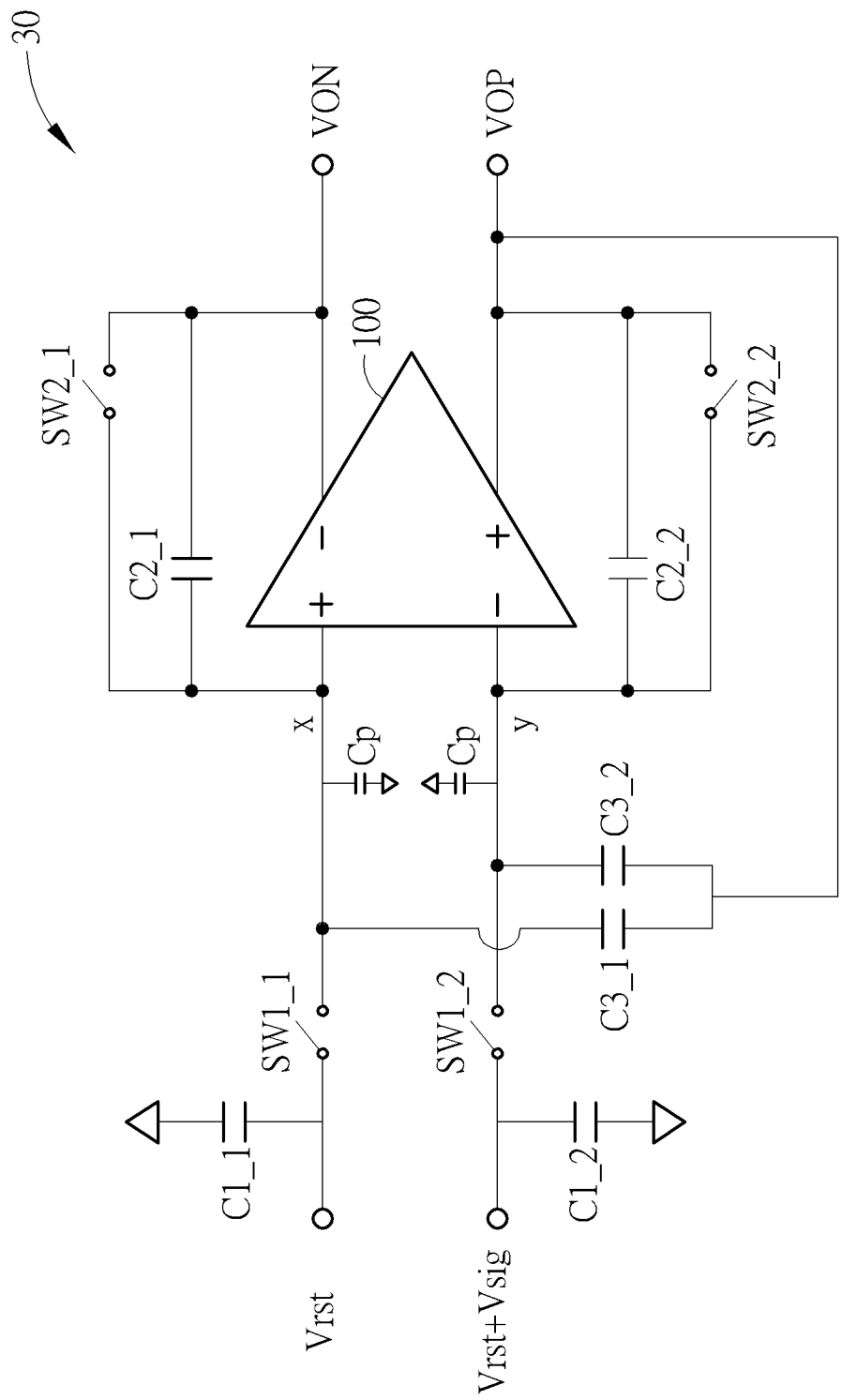
FIG. 3 is a schematic diagram of another switched-capacitor integrator according to an embodiment of the present invention.

In another embodiment, the compensation capacitor pair may be implemented in other manners. For example, please refer to FIG. 3, which is a schematic diagram of another switched-capacitor integrator 30 according to an embodiment of the present invention. The structure of the switched-capacitor integrator 30 is similar to the structure of the switched-capacitor integrator 10, and thus the signals and elements having similar functions are denoted by the same symbols. As shown in FIG. 3, the switched-capacitor integrator 30 differs from the switched-capacitor integrator 10 in that, in the switched-capacitor integrator 30, the sensing signal plus the reset signal Vrst+Vsig are received by the lower input node of the switched-capacitor integrator 30 and forwarded to the floating node y and the negative input terminal of the amplifier 100, while the upper input node of the switched-capacitor integrator 30 and the positive input terminal of the amplifier 100 receive the reset signal Vrst without the sensing signal Vsig. In such a situation, the compensation capacitors C3_1 and C3_2 are coupled to the positive output terminal of the amplifier 100 that outputs the output signal VOP. On the other hand, as shown in FIG. 1, in the switched-capacitor integrator 10, the sensing signal plus the reset signal Vrst+Vsig are received by the upper input node of the switched-capacitor integrator 10 and forwarded to the floating node x and the positive input terminal of the amplifier 100, while the lower input node of the switched-capacitor integrator 10 and the negative input terminal of the amplifier 100 receive the reset signal Vrst without the sensing signal Vsig. In such a situation, the compensation capacitors C3_1 and C3_2 are coupled to the negative output terminal of the amplifier 100 that outputs the output signal VON.

The compensation capacitors C3_1 and C3_2 in the switched-capacitor integrator 30 may stabilize the voltage at the floating nodes x and y by reducing or canceling the signal-dependent component in the floating node voltage. That is, the compensation capacitors C3_1 and C3_2 in the switched-capacitor integrator 30 may achieve similar effects as those in the switched-capacitor integrator 10. The related operations are similar to those described in the above paragraphs, and will not be narrated herein.

Figure 4:
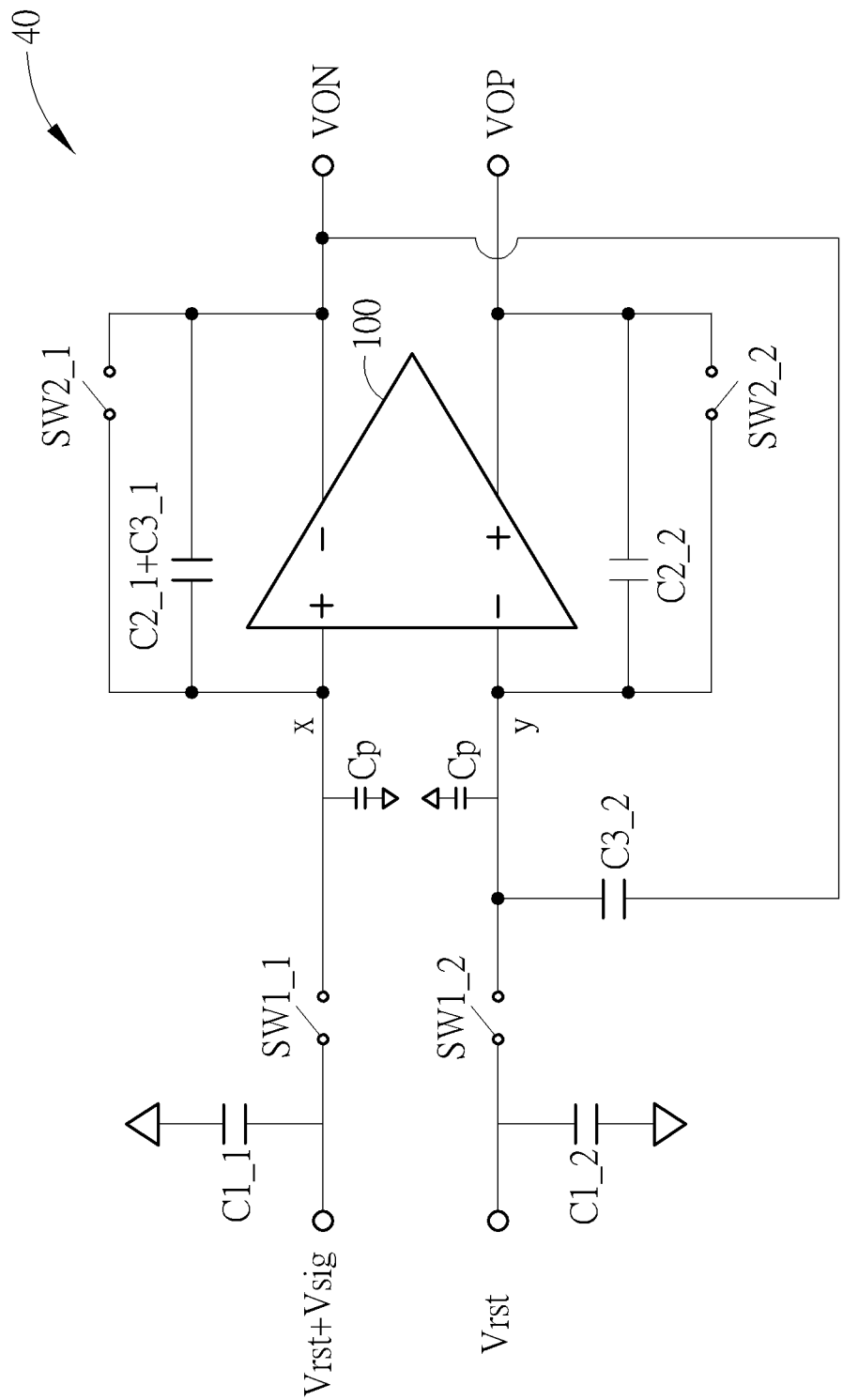
FIG. 4 is a schematic diagram of a further switched-capacitor integrator according to an embodiment of the present invention.

Please refer to FIG. 4, which is a schematic diagram of a further switched-capacitor integrator 40 according to an embodiment of the present invention. The structure of the switched-capacitor integrator 40 is similar to the structure of the switched-capacitor integrator 10, and thus the signals and elements having similar functions are denoted by the same symbols. As shown in FIG. 4, the switched-capacitor integrator 40 differs from the switched-capacitor integrator 10 in that, in the switched-capacitor integrator 40, the feedback capacitor C2_1 and the compensation capacitor C3_1 originally in the switched-capacitor integrator 10 are combined as a single capacitor C2_1+C3_1. As shown in FIG. 1, both the feedback capacitor C2_1 and the compensation capacitor C3_1 are coupled between the floating node x and the upper output node of the switched-capacitor integrator 10. These two capacitors may be combined to a single capacitor having a capacitance value equal to summation of their capacitance values without changing the operations of the capacitors and the switched-capacitor integrator.

Figure 5:
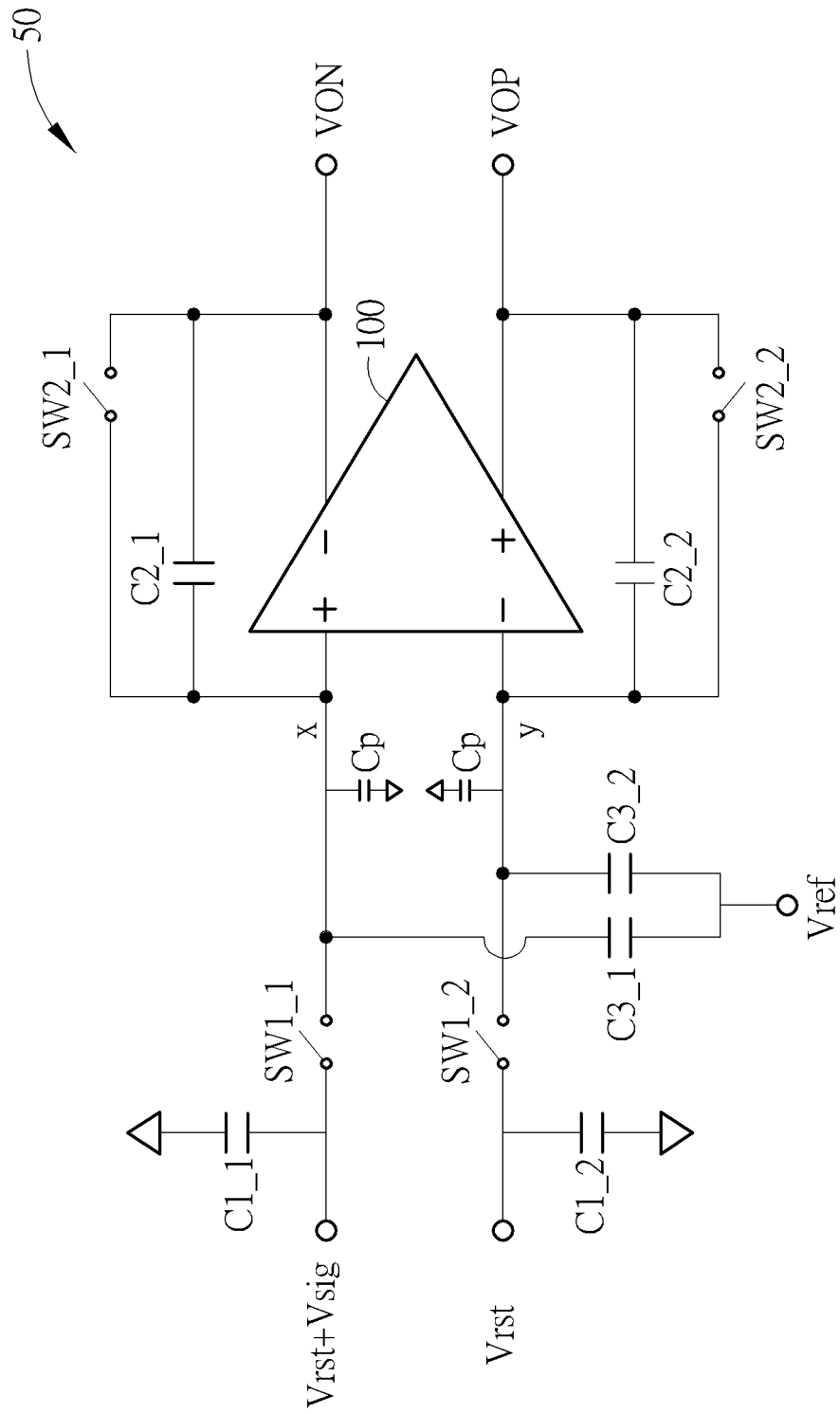
FIG. 5 is a schematic diagram of an additional switched-capacitor integrator according to an embodiment of the present invention.

Please refer to FIG. 5, which is a schematic diagram of an additional switched-capacitor integrator 50 according to an embodiment of the present invention. The structure of the switched-capacitor integrator 50 is similar to the structure of the switched-capacitor integrator 10, and thus the signals and elements having similar functions are denoted by the same symbols. As shown in FIG. 5, the switched-capacitor integrator 50 differs from the switched-capacitor integrator 10 in that, in the switched-capacitor integrator 50, the compensation capacitors C3_1 and C3_2 are coupled to a reference node instead of an output node of the switched-capacitor integrator 50. More specifically, the compensation capacitor C3_1 is coupled between the floating node x and the reference node, and the compensation capacitor C3_2 is coupled between the floating node y and the reference node. The compensation capacitors C3_1 and C3_2 may receive a reference voltage Vref from the reference node.

The reference voltage Vref may have any proper voltage value capable of reducing or canceling the voltage variation and signal dependency of the floating nodes x and y. In an embodiment, the reference voltage Vref may be equal to a zero voltage. By setting Vref=0, the voltage Vx at the floating nodes x and y may be derived in a similar manner and obtained as follows:

$$Vx = \frac{C1 \cdot Vrst + (C2 + C3 + Cp) \cdot Vcom + 0.5 \cdot C1 \cdot Vsig}{C1 + C2 + C3 + Cp}. \quad (9)$$

By comparing Equation (9) derived based on the switched-capacitor integrator 50 with Equation (8) derived without the compensation capacitors, the signal-dependent component 0.5·C1·Vsig in the numerator is identical, but the denominator of Equation (9) becomes larger since the capacitance value C3 is included. The increasing denominator leads to decreasing signal dependency of the voltage Vx under the same signal-dependent component 0.5·C1·Vsig; hence, the voltage variation of the floating nodes x and y due to variations of received sensing signals may still be reduced.

To sum up, the present invention provides a signal processing circuit having a pair of compensation capacitors coupled between the floating nodes and an output node of the signal processing circuit or coupled between the floating nodes and a reference node. The compensation capacitors may reduce or cancel the voltage variation and signal dependency on floating nodes of the signal processing circuit, so that the voltage of the floating nodes may be immune to possible large variations generated from the sensing signals. This maintains the floating nodes within a small voltage range, and thus the signal processing circuit is able to operate in its normal voltage range. Since the voltage variations at the floating nodes are reduced, the charge injection problem accompanied by the switched-capacitor operations may also be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, having a pair of input nodes and a pair of output nodes, the signal processing circuit comprising:
- a first switch pair, coupled between the pair of input nodes and a plurality of floating nodes;
- a second switch pair, coupled between the plurality of floating nodes and the pair of output nodes;
- an amplifier, coupled between the plurality of floating nodes and the pair of output nodes;
- a first compensation capacitor, coupled between a first floating node among the plurality of floating nodes and a first output node among the pair of output nodes without switching; and
- a second compensation capacitor, coupled between a second floating node among the plurality of floating nodes and the first output node without switching.

2. The signal processing circuit of claim 1, wherein the first compensation capacitor and the second compensation capacitor are configured to decrease a signal-dependent component in a voltage of the plurality of floating nodes.

3. The signal processing circuit of claim 1, further comprising:
- a feedback capacitor pair, coupled between the plurality of floating nodes and the pair of output nodes.

4. The signal processing circuit of claim 3, wherein a capacitance value of the first compensation capacitor and the second compensation capacitor is equal to a capacitance value of the feedback capacitor pair, to cancel a signal-dependent component in a voltage of the plurality of floating nodes.

5. The signal processing circuit of claim 1, further comprising:
- an input capacitor pair, coupled to the pair of input nodes.

6. The signal processing circuit of claim 1, wherein the amplifier comprises a positive input terminal coupled to the first floating node, a negative input terminal coupled to the second floating node, a negative output terminal coupled to the first output node of the signal processing circuit, and a positive output terminal coupled to a second output node among the pair of output nodes of the signal processing circuit.

7. The signal processing circuit of claim 6, wherein the amplifier is configured to receive a sensing signal plus a reset signal from a first input node among the pair of input nodes via the positive input terminal and configured to receive the reset signal without the sensing signal from a second input node among the pair of input nodes via the negative input terminal, and the first compensation capacitor and the second compensation capacitor are coupled to the negative output terminal of the amplifier.

8. The signal processing circuit of claim 6, wherein the amplifier is configured to receive a sensing signal plus a reset signal from a first input node among the pair of input nodes via the negative input terminal and configured to receive the reset signal without the sensing signal from a second input node among the pair of input nodes via the positive input terminal and the first compensation capacitor and the second compensation capacitor are coupled to the positive output terminal of the amplifier.

9. The signal processing circuit of claim 1, wherein in a reset phase, the first switch pair is turned off, and the second switch pair is turned on to reset voltages at the plurality of floating nodes to a common-mode voltage.

10. The signal processing circuit of claim 1, wherein in a conversion phase, the second switch pair is turned off, and the first switch pair is turned on to couple an input signal pair of the signal processing circuit to the plurality of floating nodes.

11. A signal processing circuit, having a pair of input nodes and a pair of output nodes, the signal processing circuit comprising:
- a first switch pair, coupled between the pair of input nodes and a plurality of floating nodes;
- a second switch pair, coupled between the plurality of floating nodes and the pair of output nodes;
- an amplifier, coupled between the plurality of floating nodes and the pair of output nodes;
- a first compensation capacitor, coupled between a first floating node among the plurality of floating nodes and a reference node without switching; and
- a second compensation capacitor, coupled between a second floating node among the plurality of floating nodes and the reference node without switching.

12. The signal processing circuit of claim 11, wherein the first compensation capacitor and the second compensation capacitor are configured to decrease a signal-dependent component in a voltage of the plurality of floating nodes.

13. The signal processing circuit of claim 11, further comprising:
- a feedback capacitor pair, coupled between the plurality of floating nodes and the pair of output nodes.

14. The signal processing circuit of claim 11, wherein the first compensation capacitor and the second compensation capacitor are configured to receive a zero voltage from the reference node.

15. The signal processing circuit of claim 11, further comprising:
- an input capacitor pair, coupled to the pair of input nodes.

16. The signal processing circuit of claim 11, wherein the amplifier comprises a positive input terminal coupled to the first floating node, a negative input terminal coupled to the second floating node, a negative output terminal coupled to a first output node among the pair of output nodes of the signal processing circuit, and a positive output terminal coupled to a second output node among the pair of output nodes of the signal processing circuit.

17. The signal processing circuit of claim 16, wherein the amplifier is configured to receive a sensing signal plus a reset signal from a first input node among the pair of input nodes via the positive input terminal, and configured to receive the reset signal without the sensing signal from a second input node among the pair of input nodes via the negative input terminal.

18. The signal processing circuit of claim 16, wherein the amplifier is configured to receive a sensing signal plus a reset signal from a first input node among the pair of input nodes via the negative input terminal, and configured to receive the reset signal without the sensing signal from a second input node among the pair of input nodes via the positive input terminal.

19. The signal processing circuit of claim 11, wherein in a reset phase, the first switch pair is turned off, and the second switch pair is turned on to reset voltages at the plurality of floating nodes to a common-mode voltage.

20. The signal processing circuit of claim 11, wherein in a conversion phase, the second switch pair is turned off, and the first switch pair is turned on to couple an input signal pair of the signal processing circuit to the plurality of floating nodes.

* * * * *